United States Patent [19]

Tengler et al.

[11] Patent Number: 4,709,132
[45] Date of Patent: Nov. 24, 1987

[54] SATURATION MONITORING ARRANGEMENT AND METHOD OF CONTROL FOR A FREQUENCY-CONVERTER WELDING DEIVCE

[75] Inventors: Hermann Tengler, Buchs; Paul Mettler, Bremgarten, both of Switzerland

[73] Assignee: Elpatronic AG, Switzerland

[21] Appl. No.: 808,338

[22] Filed: Dec. 12, 1985

[30] Foreign Application Priority Data

Dec. 14, 1984 [CH] Switzerland .......................... 5945/84

[51] Int. Cl.$^4$ .............................................. B23K 11/24
[52] U.S. Cl. ..................................... 219/110; 219/116; 363/56
[58] Field of Search ............... 219/116, 108, 109, 110; 363/50, 75, 56

[56] References Cited

U.S. PATENT DOCUMENTS

| | | | |
|---|---|---|---|
| 2,473,576 | 6/1949 | Dawson | 219/116 |
| 3,697,855 | 10/1972 | Kernick et al. | 363/56 |
| 4,042,872 | 8/1977 | McLeod | 363/56 |
| 4,127,894 | 11/1978 | Bishop et al. | 363/56 |
| 4,282,417 | 8/1981 | Jurek | 219/116 |
| 4,439,822 | 3/1984 | Cocconi | 363/75 |

Primary Examiner—Clifford C. Shaw
Attorney, Agent, or Firm—McCormick, Paulding & Huber

[57] ABSTRACT

A measuring winding (208) which is connected to a signal frequency generator is additionally disposed on the core (206) of a welding transformer (TR2). A voltage depending on the state of saturation of the core (206) is tapped off at the measuring winding (208) by a detector circuit (204). An amplitude demodulator (204b) delivers a direct voltage signal which is inversely proportional to the saturation. By comparison with a reference value, a discriminator circuit determines whether a threshold value related to saturation has already been reached or not. If it is reached, the firing of the power semiconductors is interrupted by a blocking signal. With this saturation monitoring arrangement, the welding device can be operated more easily and the welding transformer can be utilized in the optimum manner. The method of control becomes considerably simpler because the welding time no longer needs to be split up into individual impuses by the operator.

8 Claims, 11 Drawing Figures

SATURATION MONITORING ARRANGEMENT AND METHOD OF CONTROL FOR A FREQUENCY-CONVERTER WELDING DEIVCE

The invention relates to an arrangement for a frequency-converter welding device to monitor the saturation of the welding transformer which receives positive and negative current impulses from power semiconductors controlled by a control unit and which comprises a core with three legs of which the middle leg carries the primary and the secondary winding.

In addition, the invention relates to a method of controlling a frequency-converter welding device.

A monitoring device for resistance welding devices is known (DE-PS No. 11 25 573) wherein the voltage at the welding transformer is monitored. During the operation of resistance welding devices which are provided with vapour or gas discharge tubes, it is necessary to monitor the welding current and the discharge tubes because even in the event of failure of one tube, on the one hand a current occurs which is insufficient for the production of a neat weld and on the other hand an asymmetrical magnetization of the welding transformer connected up results and hence its destruction under certain circumstances. In this known monitoring device, only the primary current and the primary voltage are suitable for the monitoring of the welding operation, for practical reasons. For this purpose, an auxiliary transformer is used which is connected in parallel to the primary winding of the welding transformer and the presence of the voltage is checked by means of a series connection of a relay circuit and a controllable circuit element and the decision "ignition effected" or "ignition not effected" is derived from this. With this known monitoring device, the welding transformer can only be protected from inadmissible permanent currents which may result through saturation of its iron core as a result of failure of one tube branch or in the event of grossly asymmetrical phase control. The saturation itself, which may also be caused if no tube branch has failed or there is no grossly asymmetrical phase control, obviously cannot be avoided by this known monitoring device. In addition, it is a disadvantage of the known monitoring device that a conclusion about the behaviour of the transformer is drawn from a measurement in the primary circuit whereas the more decisive quantities would be its transmission characteristics (secondary voltage or secondary current).

In order to obtain better evidence about the behaviour of the transformer, in a known arrangement for the protection of transformers and their switchgear (DE-AS No. 10 29 457), the magnetic flux of the transformer is approximately simulated in a saturable reactance. This known arrangement is intended to ensure that certain maximum values of the starting current are adhered to by switching on and off in the correct phase, in that, inter alia, care is taken to ensure that the transformer is always switched on with the half wave of the voltage which is directed counter to the half wave last applied. In addition, it is intended to prevent one tube from failing when a so-called antiparallel connection of the tubes is used and as a result only the half waves in one direction being connected to the transformer. In this case, saturation of the transformer would occur after a certain number of half waves. The known arrangement therefore aims at switching off the transformer in such good time that the transformer and the switchgear are protected from the continuation of the saturation currents which are very heavy in some circumstances. The arrangement contains a series connection of a resistor and a saturable reactor, the saturation flux of which must be at least equal to the voltage-time integral of a half wave, which series connection is connected in parallel with the transformer so that in the absence of one half wave or in the event of switching on at the wrong moment, the reactor is saturated and a voltage pulse occurs at the resistor and is used to initiate a triggering operation, for example to switch off the ignition device of gas-discharge tubes. It is a disadvantage of this known arrangement that the state of saturation of the transformer to be protected can only be detected approximately because the saturable reactor is connected to the primary circuit of the transformer and in addition a conclusion about the behaviour of the transformer has to be drawn from the behaviour of the reactor.

It is true that an experimental arrangement for welding transformers is already known (Meyer, K.: Süttigungsvorgange in periodisch geschalteten, einphasigen Transformatoren zur Widerstandschweissung und Vernahren zum Schutz stromrichtergesteuerter Widerstandsschweissanlagen, dissertation, Berlin Technical University, 1962) wherein a second secondary winding is used on the core of a welding transformer to detect the flux. This experimental arrangement only serves, however, to examine the electrical behaviour of Hypersil welding transformers and led to the result that in such welding transformers, saturation through fluctuations in the operating quantities is unavoidable in welding practice, for which reason no decision could be reached from the recording of the saturation. Thus although the state of saturation of the welding transformer could be monitored by the known experimental arrangement in some circumstances, nevertheless its saturation had to be tolerated with regard to welding operation. The known experimental arrangement therefore led to the fact that, in the case of the Hypersil welding transformer, recourse was again had to detecting the primary voltage which involves the disadvantages explained above and cannot be used for a welding transformer in which saturation has to be avoided altogether.

In frequency-converter welding devices, further problems arise which cannot be overcome by the known devices and arrangements explained above. For explanation purposes, reference is made below to FIGS. 1a, 1b and FIG. 2 which show a single welding current impulse with current rise and current drop; the same impulse but with frequency-changer control; and a saturation diagram for the maximum welding-current control respectively.

Figure 1A:
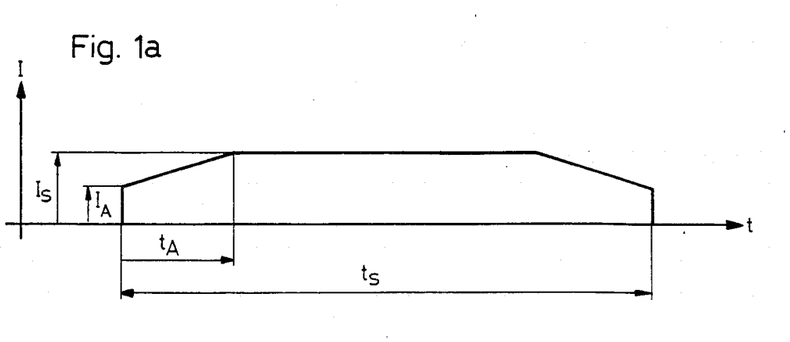
FIG. 1a-1c show explanatory diagrams.
Figure 1B:
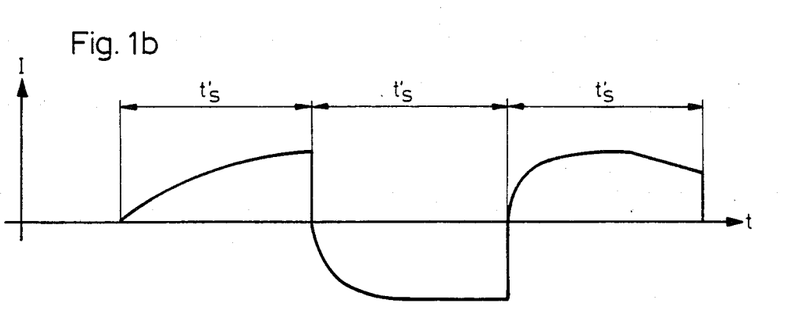
Figure 2:
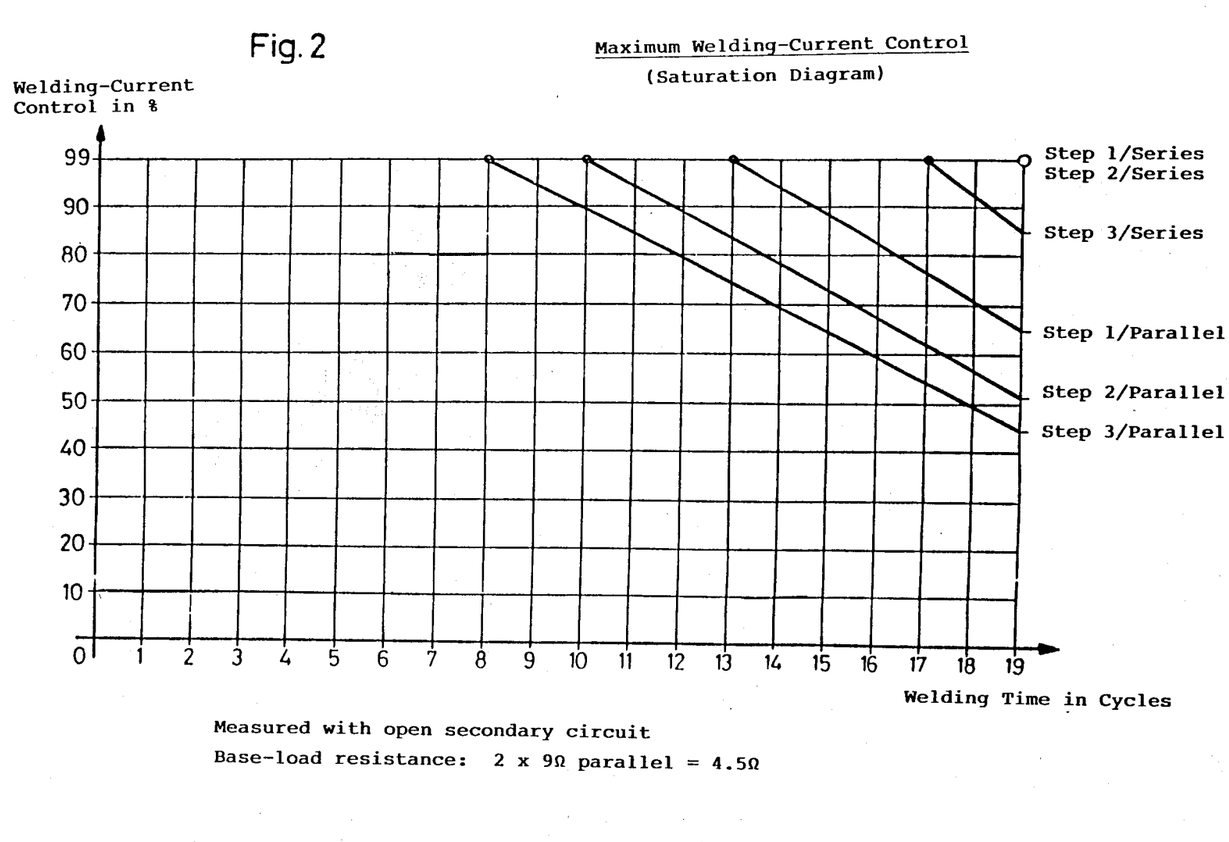
FIG. 2 shows a saturation diagram of a welding transformer which can be switched over in steps.

For a single welding-current impulse, a certain welding current $I_s$ and a welding time $t_s$ are available. The user of the welding machine must select the welding time $t_s$ so that the welding transformer does not come into the saturation range because, in this, the primary current will rise above its desired value and might damage the controlled power semiconductors through which the welding transformer is supplied with current impulses. The user of a rectifier machine therefore selects the length of the welding impulse shown in FIG. 1a with reference to the diagram shown in FIG. 2 and the user of a frequency-changer machine selects the duration $t'_s$ of an impulse as shown in FIG. 1b, that is to say he divides the single pulse shown in FIG. 1a into three individual pulses of equal length and alternating polarity in the example selected here, although the permitted time according to the diagram of FIG. 2 must not be exceeded in the course of this. If the user switches over from the step 3/series to the step 1/parallel as shown in the diagram of FIG. 2, for example, then he must also shorten the welding time by four mains cycles in order that the welding transformer may not come into the saturation assumed above 99% welding-current control. Since the control program in the control unit, into which the user of the machine feeds not only the welding current and the welding time but also, in addition, the pre-pressing time, the finish-pressing time, the removal time, a possible interval time, the number of impulses, the initial current and the rise time, does not contain any built-in safety means which protects the machine from overloading in the event of inadmissible selection of these parameters or in the event of an overvoltage in the mains and protects the controlled power semiconductors from destruction as a result of excessively heavy saturation currents, a certain safety margin is built into the transformer diagrams as a protective measure but prevents optimum utilization of the welding transformer.

Furthermore, in controlling the welding current, the user must not only take into consideration the characteristics of the welding transformer but also the requirements of the material. There are empirical values in tabular form for the materials to be welded. The user must read out the permissible parameters from cards which are different for each type of machine. This is complicated and does not rule out the danger of an erroneous selection of a parameter such as the wrong welding step for example. In the event of gross errors in the selection of parameters, the safety margin may ultimately be exceeded without the user noticing this in time. This can only be achieved by a saturation monitoring for which the known arrangements and devices described above are not suitable, however, for the reasons given.

In the conventional control of the welding current of a frequency-converter machine, it is always necessary to work with component impulses of equal length and alternate polarity because only by means of impulses of equal length and alternating polarity is it possible to prevent the transformer from coming into saturation. If the user of the machine carries out the splitting up of the impulses wrongly, however, for example if he selects two component impulses instead of three component impulses, then each component impulse is too long so that the welding transformer can nevertheless come into saturation despite the fact that impulses of equal length are used (assuming that the said safety reserve is exceeded).

It is the object of the invention to develop an arrangement of the type mentioned at the beginning so that it is sure to detect the reaching of saturation in the welding transformer and improves the control of the frequency-converter welding device so that it is considerably less dependent on the reliability of the input of parameters by the user and permits an optimum utilization of the welding transformer.

According to the invention, the solution to this problem is characterised by a a measuring winding which is distributed over two yokes originating from the middle leg and the two measuring-winding parts of which are connected in series, by a generator connected to the measuring winding to generate a measuring voltage of a specific frequency and by a detector circuit which is connected to the measuring winding in parallel to the generator and which determines, by a comparison between the measuring voltage and a reference voltage, when the inductive resistance of the measuring winding drops below a threshold value related to saturation in order to generate a signal blocking the driving of the power semiconductors.

The arrangement according to the invention provides accurate information regarding the saturation behaviour of the core of the welding transformer and, when a threshold value related to saturation is reached, switches off the firing of the power semiconductors. Thus a current input according to FIG. 1a is possible (with regard to direct current) because the splitting up into impulses corresponding to the maximum utilization of the transformer can now be controlled automatically up to saturation. Since the voltage tapped off at the measuring winding decreases as the approximation to saturation increases, it is possible, by appropriate selection of the threshold value related to saturation, to prevent the welding transformer from coming into saturation, with certainty. Since, according to the invention, the saturation of the welding transformer can be checked, much smaller safety margins are also necessary. Thus the welding transformer can be utilized in the optimum manner.

With the appropriate filtering the saturation at the measuring winding measurement is reliably prevented from being disadvantageously influenced by mains disturbances.

With hysteresis in the director circuit an oscillatory state is prevented from occurring in welding operation with switching on and off depending on saturation.

The use of the arrangement according to the invention in a method of control leads to a surprising simplification in the operation and control of the frequency-converter welding device. Operation is simplified with regard to the parameters to be preselected for the welding-current control because only the welding current and the total welding time need to be preselected but not the splitting up of the welding time into a specific number of component welding impulses, the number of which has to be selected with reference to the saturation diagram in the conventional method of control so that the welding transformer does not come into the saturation range. Since each welding impulse lasts, within the scope of the preselected welding time, until the threshold value related to saturation is reached, the control automatically determines the splitting up of the welding time into individual impulses of any length. Thus, when the saturation monitoring arrangement according to the invention is used, the frequency-converter welding device is considerably less dependent on the reliability of the input of parameters by a user.

In order that the saturation monitoring arrangement according to the invention may be able to intervene in the control, it is merely necessary to make available a digital signal with the states "threshold value related to saturation not reached" and "threshold value related to saturation reached". For this purpose, a direct voltage signal, which is inversely proportional to the saturation, is compared with a reference value by a comparator in the detector circuit. If the direct voltage is greater than the reference value, a logical 1 appears at the output of the comparator, if the voltage is lower, it deliveres a logical 0. The logical signal values can be exchanged for the correct value correlation by an inverter behind the comparator so that then "0"="threshold value related to saturation not reached" and "1"="threshold value related to saturation reached". The welding-current control which is usually already present then merely needs an additional digital input for the above-mentioned binary signals and a digital output for an alarm indication but it no longer needs an impulse counter which determines whether a preselected number of impulses has been reached because a number of impulses no longer has to be preselected.

One example of embodiment of the invention is described in more detail below with reference to the drawings.

Figure 3:
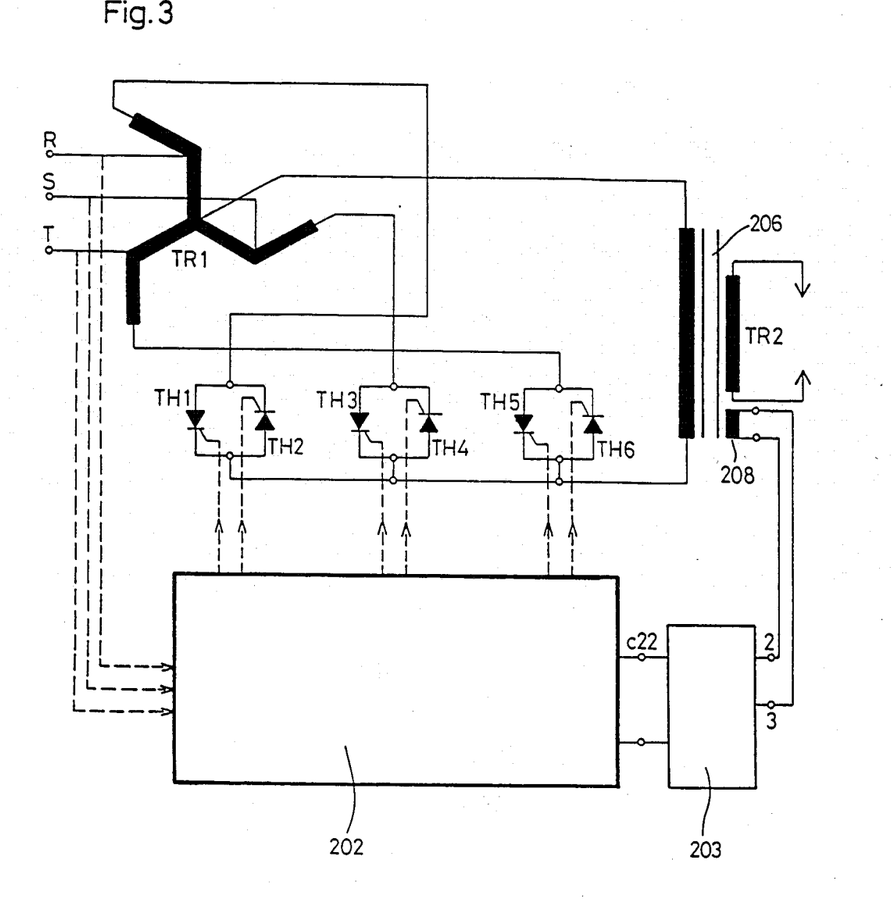
FIG. 3 shows a circuit diagram of a frequency-converter welding machine with a saturation monitoring arrangement according to the invention.

FIG. 3 shows a frequency-changer welding machine with a three-phase mains transformer TR1 which is connected in zigzag and at the output side of which there are disposed three pairs of controlled semiconductors in the form of thyristors TH1-TH6 in an antiparallel connection. Positive and negative current impulses respectively are supplied to the welding transformer TR2 by alternate rectification. The amplitude of these currents, their duration in time and their course in time are set by a digital control unit 202 which works precisely and which drives the three pairs of thyristors by means of appropriate control signals. In order to avoid saturation of the welding transformer TR2 and to keep this in magnetic equilibrium, the control unit also ensures the correct polarity of the successive impulses. In the course of this, the control unit 202 is additionally supported by a saturation monitoring arrangement which consists of an electronic circuit 203 and of a measuring winding 208 additionally disposed on the core 206 of the welding transformer TR2.

Figure 4:
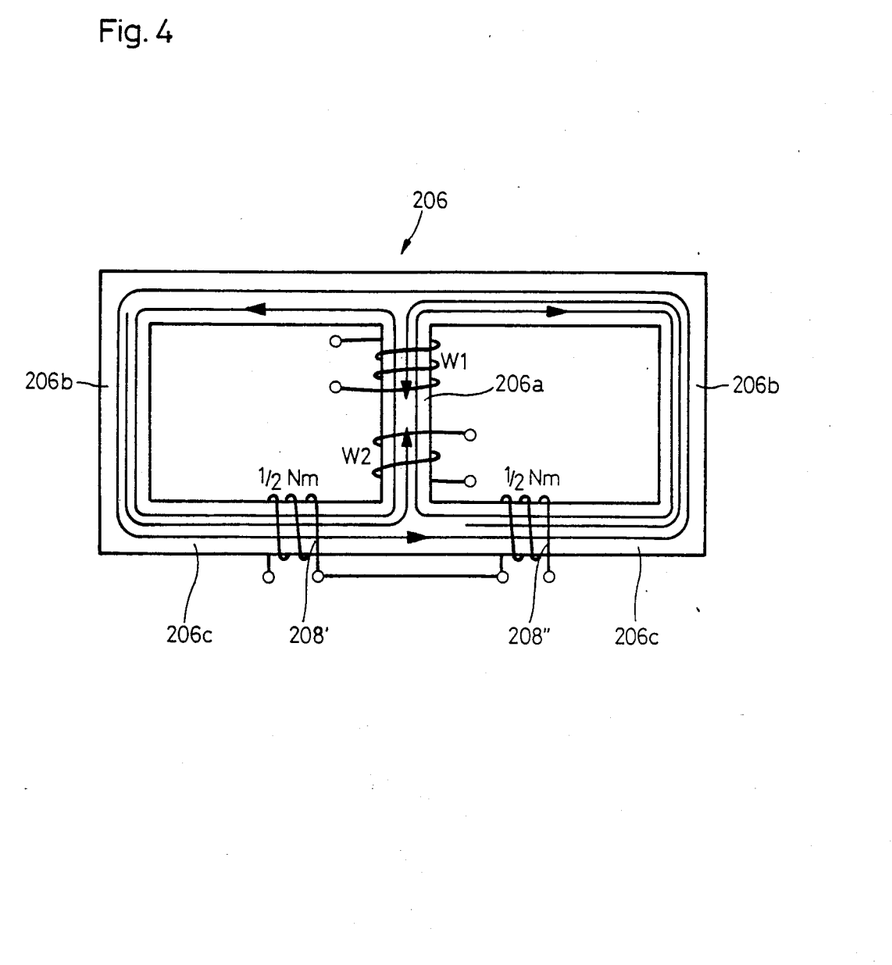
FIG. 4 shows a more detailed illustration of the core of the welding transformer of FIG. 3 with the magnetic flux distribution.

The core 206 of the welding transformer TR2 with its windings is illustrated in more detail in FIG. 4. The core 206 has a middle leg 206a and two outer legs 206b which are connected to one another by yokes 206c. The primary winding W1 and the secondary winding W2 are disposed on the middle leg 206a in the manner illustrated. The measuring winding 208 consists of two like measuring-winding parts 208' and 208", each of which is disposed on one of the yokes 206c at each side of the middle leg 206a and which are connected in series. Thus each yoke 206c is provided with half the number of turns Nm of the measuring winding. A measuring voltage is applied to the measuring winding 208 in the manner to be explained in more detail below. The fluxes which are produced by the measuring-winding parts 208' and 208" cancel one another in the middle leg 206a so that the measuring voltage does not influence the welding current of the transformer. The flux which is induced by the primary winding W1 does not generate any resulting voltage in the measuring winding because the voltages at the winding parts 208', 208" are mutually cancelled. Thus energy transmission and signal transmission are completely decoupled.

Figure 5:
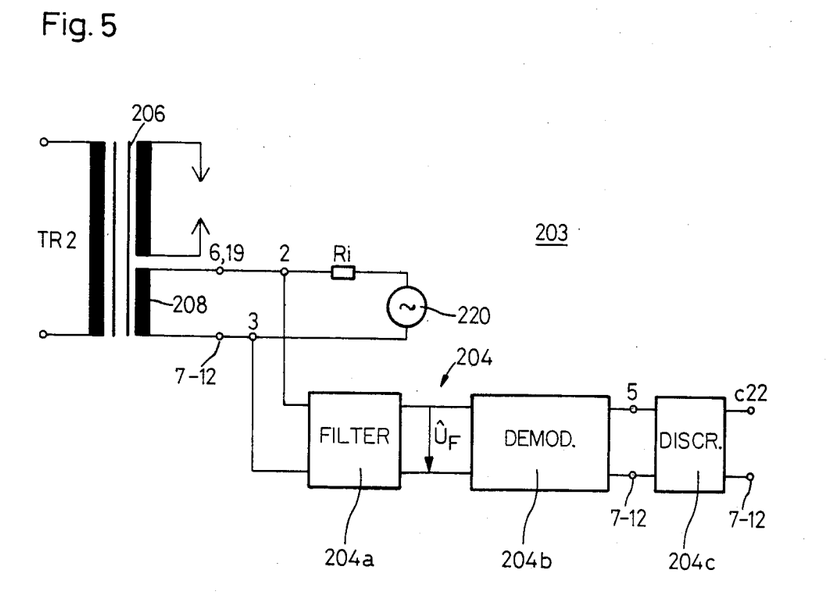
FIG. 5 shows a more detailed illustration of the saturation monitoring arrangement according to the invention connected to the welding transformer of FIG. 3.

FIG. 5 shows a more detailed illustration of the saturation monitoring arrangement. Connected to the measuring winding 208' is the electronic circuit 203 which contains a detector circuit 204 and a signal frequency generator 220. The signal frequency generator 220 is connected to the measuring winding 208, has an internal resistance Ri of about 100 Ohms and generates a rectangular voltage with a signal frequency which has a value in the range from 5 to 20 kHz and preferably a value of about 10 kHz. The measuring winding 208 has an ohmic resistance which is negligible here and an inductive resistance which depends on the magnetic state of the core 206, on the core material and on the number of turns. The detector circuit 204 is connected at its input (terminals 2 and 3) in parallel with the connections between the signal frequency generator 220 and the measuring winding 208 and the output of the detector circuit 204 (terminals c22, 7-12) is connected to the control unit 202 (FIG. 3). The detector circuit 204 consists of a high-pass filter 204a which blocks all frequencies below 1 kHz and transmits all frequencies above 1 kHz, of an amplitude demodulator 204b and of a discriminator circuit 204c. The filter 204a prevents mains disturbances from penetrating into the detector circuit 204 through the welding transformer TR2. At the output, the filter 204a delivers a sinusoidal voltage with a frequency corresponding to the generator signal frequency. This voltage is tapped off at the voltage divider formed by the internal resistance Ri and the measuring winding 208 and represents the resulting voltage which is still available at the measuring winding 208. If the core 206 is saturated by the currents flowing in the primary winding and in the secondary winding of the welding transformer TR2, the magnetic state of the core changes and the more this is saturated, the lower the magnetic resistance of the coil becomes and hence also the amplitude of the voltage which is tapped off at the measuring winding 208. At its output, the amplitude demodulator 204b delivers a direct voltage which is proportional to the amplitude of the signal-frequency sinusoidal voltage $\hat{u}_F$. The amplitude of the voltage $\hat{u}_F$ is in turn proportional to the magnetic resistance of the measuring winding 208 which is directly influenced by the saturation state of the core 206. The more the core 206 is saturated, the more magnetic lines of flux pass through the air as a result of which the magnetic resistance of the measuring winding 208 becomes so much less so that ultimately only the low winding resistance thereof is still effective. The discriminator circuit 204c is described below the reference to FIG. 9.

Figure 6:
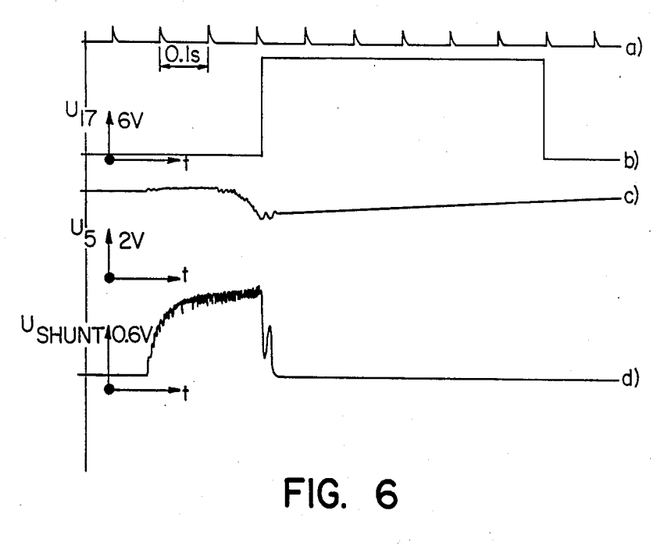
FIG. 6 shows a graph of curves which were measured in operation of the frequency-converter machine according to FIG. 3 when using the saturation monitoring arrangement according to the invention.

FIG. 6 illustrates the mode of operation of the saturation monitoring arrangement with reference to the example of a single-impulse weld. The curve in FIG. 6a shows timing signals which are generated by a timing generator (not illustrated) contained in the control unit 202. The curve 6*d* shows the welding current $I_s$ (measured as voltage u at a shunt). The curve 6*c* shows the output signal of the amplitude demodulator 204*b*. Thus, from the left-hand portion of FIG. 6 it can be seen that as the welding current $I_s$ increases, the output signal of the amplitude demodulator at first remains practically unaltered. If the welding transformer approaches saturation, the output signal of the amplitude demodulator begins to drop. If it reaches a threshold value related to saturation, the production of which value is described below with reference to FIG. 9 and the discriminator circuit 204*c*, a blocking signal illustrated in FIG. 6*b* is generated (comparator N11 in FIG. 9) which prevents further firing pulses for the thyristors TH1–TH6 (FIG. 3). The blocking signal is delivered at the terminal c22 in FIG. 9. The threshold value depending on saturation is selected so that saturation of the core 206 is certain to be avoided.

Figure 9:
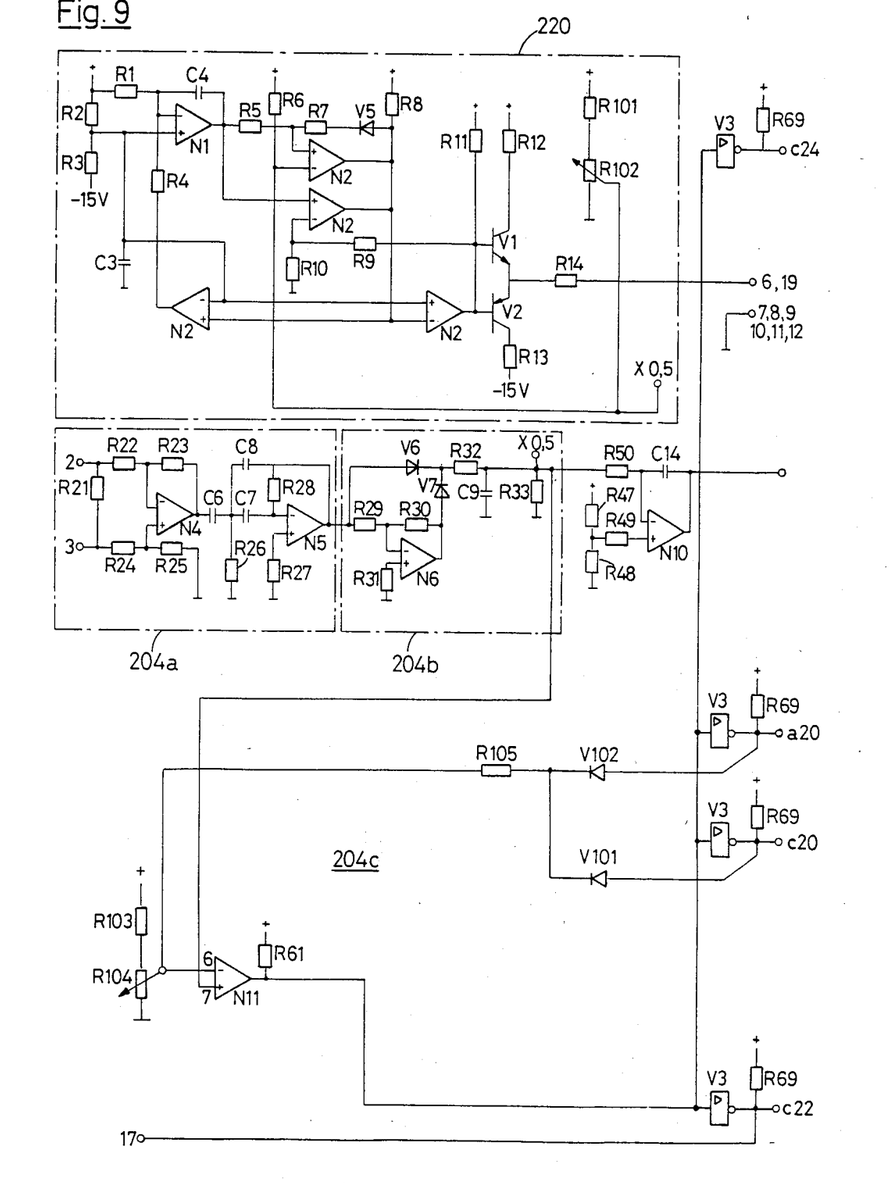

In the circuit diagram of FIG. 9, the signal frequency generator 220, the filter 204*a* and the amplitude demodulator 204*b* are each framed in chain lines. These three circuit elements do not need to be described in detail because they are ordinary commercial circuits. The components used in the circuit of FIG. 9 can be seen from the list of parts given at the end of the specification. Apart from the said circuit elements, the discriminator circuit 204*c*, which contains the comparator N11 and with which the threshold value related to saturation is set, is illustrated in FIG. 9. The setting of this saturation threshold value is effected at an adjustable resistor R104. A voltage is tapped off at this resistor and applied to the inverting input of the comparator N11. The output voltage of the amplitude demodulator 204*b* is applied to the non-inverting input 7 of the comparator N11. The comparator N11 compares the two voltages and, when the saturation threshold value is reached, releases the blocking signal (FIG. 6*b*) which appears at the output c22. Two diodes V101 and V102, connected in parallel, are connected, in the manner illustrated in FIG. 9, on the one hand to the output of the comparator N11 through inverters V3 and on the other hand to the inverting input of the comparator N11 through a resistor R105. A hysteresis is produced by this circuit in order that the saturation threshold value which causes the saturation monitoring arrangement to respond may be greater than that which makes it ineffective again. Otherwise an oscillatory state might result.

The hysteresis is produced as follows. The adjustment of the resistor R104 determines a specific reference voltage at which the saturation monitoring arrangement should respond. If it has responded, this reference voltage is increased in order that the threshold value for the switching off (right-hand flank of the blocking signal in FIG. 6*b*) may not be equal to that for the switching on. The reference voltage delivered by the resistor R104 at the inverting input 6 of the comparator N11 remains the same at first whereas the measuring voltage applied to the non-inverting input 7 of the comparator N11 drops as the saturation range is increasingly approached and decreases below the reference voltage. When the measuring voltage drops below the reference voltage, the comparator N11 delivers a binary signal "zero" which is converted, by the inverters V3 preceding the output terminal c22, into a binary signal "one". The same signal "one" also appears at the diodes V101 and V102 and is applied, through the resistor R105, to the reference-voltage input 6 of the comparator as a result of which the reference voltage is higher after the response of the saturation monitoring arrangement. Since the reference voltage is now higher, the saturation must be lower in order to switch this signal back into the original state, and must actually be lower than that saturation which caused the response. Thus the reference voltage which has indicated that the saturation threshold value was reached and the blocking signal was generated, is somewhat lower than that voltage which then indicates that there has again been a drop below the saturation threshold value. In this manner, the welding current can, in any case, be reliably switched off and, in addition, the next thyristor can, if necessary, be prevented from being immediately fired again.

Figure 1C:
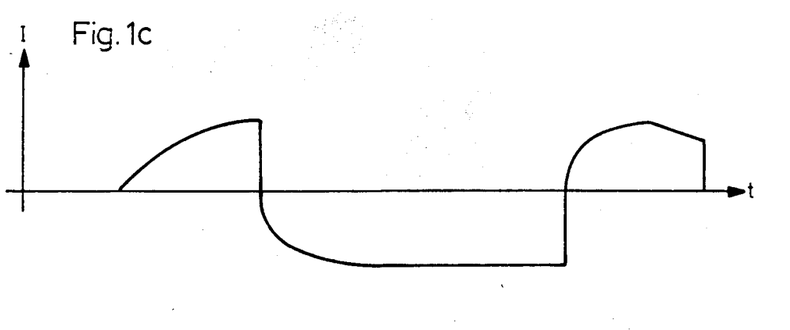

The way in which the saturation monitoring arrangement considerably simplifies and improves a conventional control of a frequency-converter welding machine will now be described below with reference to FIGS. 1, 7 and 8. The user of the welding machine sets the required welding cycle through a switchboard with encoding switches or through an interactive control panel. For this purpose, a number of differnt control parameters have to be set or, if there is a microcontrol present, be preprogrammed. For the simplest case of conventional control, these are the pressure parameters (pre-pressing time, finish-pressing time and removal time, each of 0 ... 99 cycles), and the current parameters, namely the welding time $t_s$, (FIG. 1*b*) of 0 ... 7 cycles, the interval time of 1 ... 99 cycles, the number of pulses of 1 ... 999 cycles, the starting current $I_A$ (FIG. 1*a*) of 30 ... 95%, the rise time $t_A$ (FIG. 1*a*) of 0 ... 79 cycles and the welding current $I_a$ of 30 ... 99%. All times are measured in cycles, that is to say in cycles of the mains frequency. for the following example, only the current parameters are considered and it is assumed that there are no interval times between the welding current impulses (FIG. 1*b*).

Figure 7:
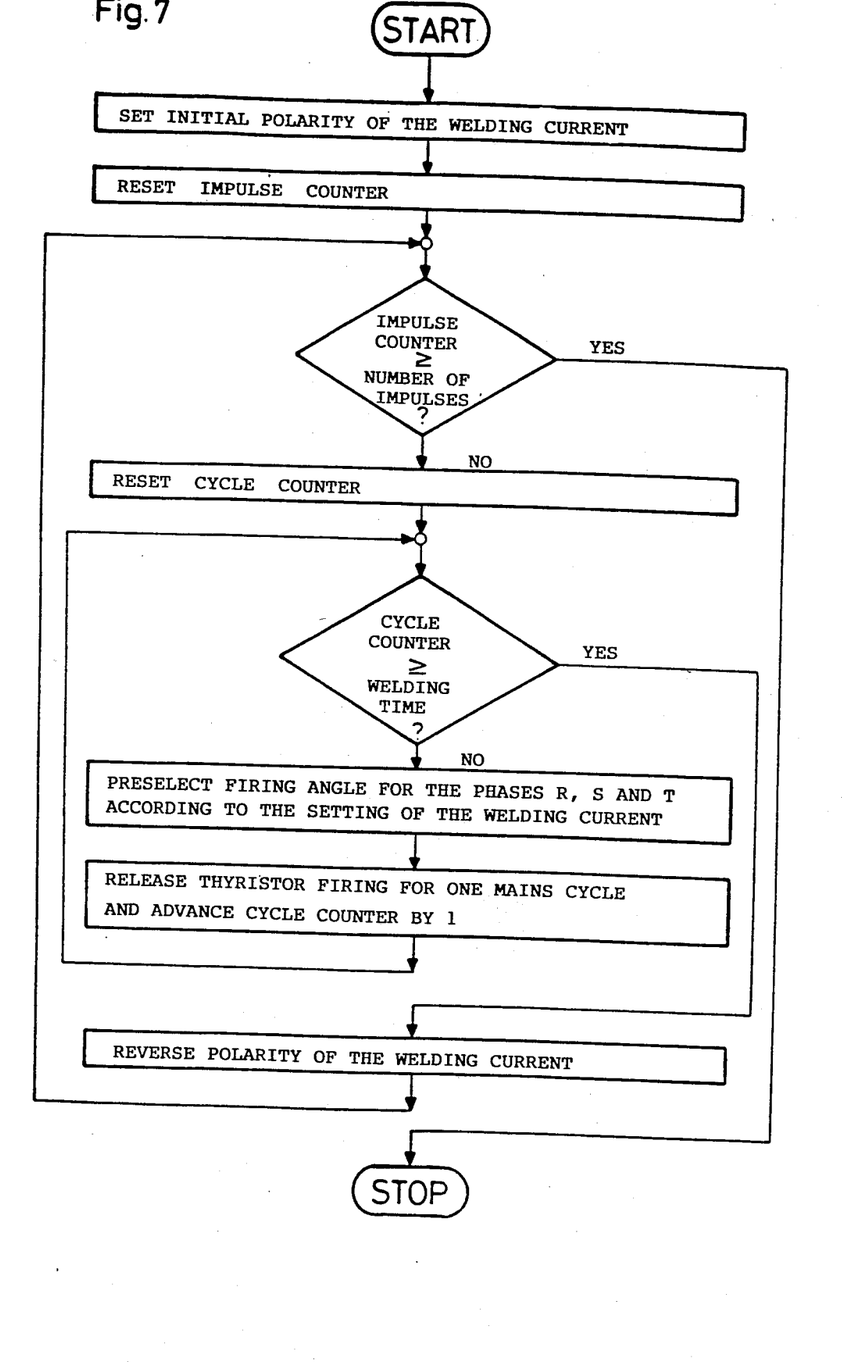
FIG. 7 shows a flow chart of the control of a frequency-changer welding machine without the saturation monitoring arrangement according to the invention.

In the conventional method of control, according to the minimum program shown in FIG. 7, the initial polarity of the welding current is set by the user of the machine. In addition he has to set a specific number of welding impulses (in the example in FIG. 1*b* this is three welding impulses). An impulse counter which is contained in the control unit 202 and which is first reset, determines whether the set number of impulses has already been completed or not. If this is not the case, the cycle counter is reset so that this can determine, by counting the mains cycles for a welding impulse, whether the set welding time t'$_s$ has already been reached or not. Since it was reset to zero, no welding time has yet been completed so that the result is NO. According to the setting of the welding current, the firing angle for the phase entry control is now set so that the required welding current can be reached. Then the thyristor firing for one mains cycle is released and the cycle counter is increased by one because the release was effected for one cycle. After that, the cycle counter again checks whether the welding time has already been reached. This is again not the case, a firing pulse is again produced, the cycle counter is again increased by one and so on until the cycle counter finds that the welding time t'$_s$ is at an end. The interrogation at the cycle counter then results in YES, which has the effect that the polarity of the welding current is changed. The cycle counter is again reset and the same operation takes place for a welding impulse of opposite polarity.

Figure 8:
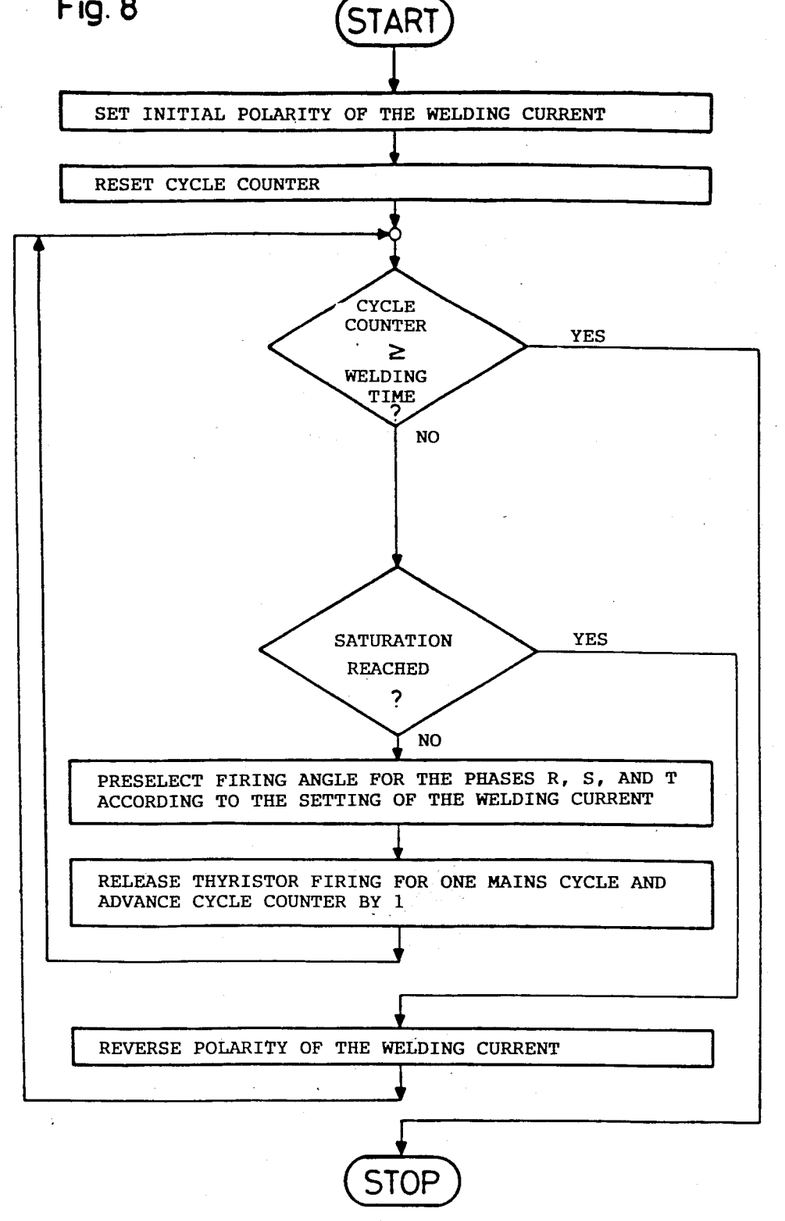
FIG. 8 shows a flow chart of the control of a frequency-changer welding machine with the saturation monitoring arrangement according to the invention and FIG. 9 shows a detailed circuit diagram of a detector circuit contained in the saturation monitoring arrangement according to the invention.

The flow chart in FIG. 8 has substantially the same construction as the flow chart in FIG. 7 but here the impulse counter is missing because the welding time is assumed to be not the time $t_s$ of a component welding impulse but the whole welding time $t_s$ (See FIGS. 1a and 1b). In addition, after the comparison of the contents of the cycle counter with the welding time, it is always ascertained whether the saturation threshold value has already been reached or not. This control, working with consideration of the saturation monitoring, therefore has the following sequence of operations.

First the initial polarity of the welding current is again set (the welding current $I_s$ itself is set later by the firing angle). The cycle counter is reset to zero. Since its contents are zero, that is to say less than the set welding time, the answer is NO. The question as to whether saturation has been reached must likewise be answered by NO because the welding operation has not yet begun. Then the firing angle for the phases R, S and T is preselected according to the setting of the welding current, that is to say the welding current $I_s$ is set in this step. The thyristor firing is released for one mains cycle so that now the welding current flows for one mains cycle and the cycle counter is increased by one. The check as to whether saturation has been reached again results in NO because the saturation threshold value cannot have been reached after one mains cycle. Then welding is again effected for one mains cycle and so on until the saturation threshold value is reached.

The essential difference between the control according to FIG. 8 and the conventional control shown in FIG. 7 consists in that the length of welding impulse is no longer limited to a specific number of cycles and instead the impulse can be made as long as desired until the welding transformer reaches the saturation threshold value. Thus work is carried on with an impulse length which the user of the machine does not need to set in advance and cannot even know in advance.

When a welding impulse is terminated, the polarity of the welding current $I_s$ is reversed. Then welding is effected with the opposite welding impulse until the saturation threshold value is again reached. If the end of the welding time should be reached previously, the welding is naturally terminated before the saturation threshold value is reached. With the control shown in FIG. 7, the welding transformer may come into the saturation range, in an undesirable manner, if the user of the machine has selected an unsuitable number of component welding impulses for a specific transformer step with reference to the saturation diagram of FIG. 2, as was explained in more detail at the beginning. With the control shown in FIG. 8, the user only has to set the welding current and the total welding time $t_s$ in the example selected and the control then effects the distribution of this welding time over the component impulses automatically depending on the monitoring of the saturation threshold value. Moreover, with this method of control, component impulses of equal length are no longer necessary because the switching over from one component impulse to another always takes place depending on the saturation threshold value so that after the switching over from a first impulse to a second, the second impulse can easily be longer than the first impulse.

The curve illustrated in FIG. 6d was taken from an experimental construction so that the welding current $I_s$ has not immediately dropped to zero after the leading edge of the blocking signal (left-hand edge in FIG. 6b) although the saturation threshold value was already reached. The reason for this is that the last thyristor to be conducting only ceases to conduct when the current flowing through it has sunk to zero. In the experimental construction, only the welding impulse produced by one thyristor was examined, that is to say, following on the switching off of its firing pulses, no other thyristor with reversed polarity was fired. In a practical case, after the switching off of the firing of the conducting thyristor, the next thyristor with opposite polarity is fired which then pulls the current down to zero and in the opposite direction so that the dying-out process which can be seen in FIG. 6d is eliminated.

List of the components used (circuit shown in FIG. 9):

| Reference numeral | Designation/features | | | |
|---|---|---|---|---|
| C1 | Tantalum capacitor | 22 µF | 10% | 35 V |
| C2 | Tantalum capacitor | 22 µF | 10% | 35 V |
| C3 | Multilayer ceramic capacitor | 10 nF | 10% | 50 V |
| C4 | Multilayer ceramic capacitor | 22 nF | 10% | 50 V |
| C6 | Polypropylene capacitor | 10 nF | 1% | 63 V |
| C7 | Polypropylene capacitor | 10 nF | 1% | 63 V |
| C8 | Polypropylene capacitor | 10 nF | 1% | 63 V |
| C9 | Multilayer ceramic capacitor Cw30C224M235 B37984-J5224-K | 220 nF | 10% | 50 V |
| C14 | Multilayer ceramic capacitor CW20C473M242 B37987-J5473-K | 47 nF | 10% | 50 V |
| N1 | Operational amplifier LF411CN | J-FET | | |
| N2 | Quad comparator | LM 339 | | |
| N4 | Operational amplifier LF411CN | J-FET | | |
| N5 | Operational amplifier LF411CN | J-FET | | |
| N6 | Operational amplifier LF411CN | J-FET | | |
| N10 | Two-stage operational amplifier | LM 358N | | |
| N11 | Comparator | MC1556 | | |
| R1 | Metal film resistor | 20 kOHM | 1% | 1/4 W |
| R2 | Metal film resistor | 20 kOHM | 1% | 1/4 W |
| R3 | Metal film resistor | 20 kOHM | 1% | 1/4 W |
| R4 | Carbon-film resistor | 10 kOHM | 5% | 1/5 W |
| R5 | Carbon-film resistor | 22 kOHM | 5% | 1/5 W |

-continued

List of the components used (circuit shown in FIG. 9):

| Reference numeral | Designation/features | | | |
|---|---|---|---|---|
| R6 | Carbon-film resistor | 1 MOHM | 5% | 1/3 W |
| R7 | Carbon-film resistor | 1.8 kOHM | 5% | 1/5 W |
| R8 | Carbon-film resistor | 3.9 kOHM | 5% | 1/5 W |
| R9 | Carbon-film resistor | 150 kOHM | 5% | 1/5 W |
| R10 | Carbon-film resistor | 1 kOHM | 5% | 1/5 W |
| R11 | Carbon-film resistor | 6.8 kOHM | 5% | 1/5 W |
| R12 | Carbon-film resistor | 27 OHM | 5% | 1/5 W |
| R13 | Carbon-film resistor | 27 OHM | 5% | 1/5 W |
| R14 | Carbon-film resistor | 100 OHM | 5% | 1/5 W |
| R21 | Metal film resistor | 47 kOHM | 1% | 1/4 W |
| R22 | Metal film resistor | 2.2 kOHM | 1% | 1/4 W |
| R23 | Metal film resistor | 2.2 kOHM | 1% | 1/4 W |
| R24 | Metal film resistor | 2.2 kOHM | 1% | 1/4 W |
| R25 | Metal film resistor | 2.2 kOHM | 1% | 1/4 W |
| R26 | Metal film resistor | 5.6 kOHM | 1% | 1/4 W |
| R27 | Metal film resistor | 47 kOHM | 1% | 1/4 W |
| R28 | Metal film resistor | 47 kOHM | 1% | 1/4 W |
| R29 | Metal film resistor | 10 kOHM | 1% | 1/4 W |
| R30 | Metal film resistor | 10 kOHM | 1% | 1/4 W |
| R31 | Metal film resistor | 4.7 kOHM | 1% | 1/4 W |
| R32 | Metal film resistor | 10 kOHM | 1% | 1/4 W |
| R33 | Metal film resistor | 10 kOHM | 1% | 1/4 W |
| R47 | Metal film resistor | 15 kOHM | 1% | 1/4 W |
| R48 | Metal film resistor | 680 OHM | 1% | 1/4 W |
| R49 | Carbon-film resistor | 100 kOHM | 5% | 1/5 W |
| R50 | Carbon-film resistor | 100 kOHM | 5% | 1/5 W |
| R69 | Metal film resistor | 10 kOHM | 1% | 1/4 W |
| R101 | Metal film resistor | 390 OHM | 1% | 1/4 W |
| R102 | Wire-wound potentiometer | 1 kOHM | 1% | 1/4 W |
| R103 | Metal film resistor | 2 kOHM | 1% | 1/4 W |
| R104 | Wire-wound potentiometer | 1 kOHM | 1% | 1/4 W |
| R105 | Metal film resistor | 1 kOHM | 1% | 1/4 W |
| V1 | Small-signal transistor 1N4448/BAX 13 | NPN | 50 V | 4 nS |
| V6 | High-speed diode 1N4448/BAX 13 | 75 mA | 50 V | 4 nS |
| V7 | High-speed diode 1N4448/BAX 13 | 75 mA | 50 V | 4 nS |
| V101 | Diode 1N4148/BAX 13 | | | |
| V102 | Diode 1N4148/BAX 13 | | | |

We claim:

1. Apparatus for monitoring the saturation of a welding transformer in a frequency converter welding device, the transformer receiving positive and negative current impulses from power semiconductors controlled by a control unit and having a core with three legs of which the middle leg carries the primary winding and the secondary winding, the apparatus comprising: a measuring winding (208) having two parts distributed respectively over two yokes (206c) originating from the middle leg (206a) of the transformer and being connected in series, a generator (220) connected to the measuring winding (208) to generate a measuring voltage of a specific frequency across the winding, and detector circuit means (204) connected to the measuring winding (208) in parallel with the generator (220) for determining by a comparison between the measuring voltage detected across the winding and a reference voltage when the inductive resistance of the measuring winding (208) drops below a threshold value related to saturation in order to generate a signal (FIG. 6b) blocking the drive of the power semiconductors (TH1-TH6).

2. Apparatus as claimed in claim 1 wherein the generator (220) is a signal frequency generator generating a rectangular voltage with a frequency in the range from 5 to 20 kHz.

3. Apparatus as claimed in claim 2, wherein the signal frequency generator (220) generates a rectangular voltage with a frequency of 10 kHz.

4. Apparatus as claimed in claim 3 wherein the filter transmits all frequencies beyond 1 kHz.

5. Apparatus as claimed in claim 1 wherein the detector circuit (204) includes a filter (204a) connected to the winding, an amplitude demodulator (204b) connected to receive filtered signals from the filter and a discriminator circuit (204c) receiving the demodulator signal and comparing the received demodulator signal with a reference signal representing a predetermined threshold of saturation.

6. Apparatus as claimed in claim 4 wherein a hysteresis circuit (V101, V102, R105) is connected to the discriminator circuit (204c) to increase a reference voltage corresponding to the threshold value of the inductive resistance of the measuring winding (208) each time the threshold value is reached.

7. Apparatus as claimed in claim 6, wherein the discriminator circuit (204c) contains a comparator (N11), the non-inverting input of which is connected to the output (5) of the amplitude demodulator (204b) while its inverting input is connected to a voltage divider (R103, R104) to adjust the reference voltage corresponding to the threshold value, and the output of which is connected both to the control unit (202) and to its inverting input through a diode and resistor circuit (V101, V102, R105).

8. A method of controlling a frequency converter welding device having a three-legged transformer in which saturation of transformer drive currents is monitored and controlled by a measuring voltage and a generated reference voltage of specific frequency to block the drive currents for the transformer, comprising the steps of: preselecting the total welding time for a welding cycle and producing within the preselected welding time, the welding current until the threshold value related to saturation of the transformer is reached, during both single-impulse and multi-impulse welding.

* * * * *